US005465468A

United States Patent [19]

Manna

[11] Patent Number: 5,465,468

[45] Date of Patent: Nov. 14, 1995

[54] METHOD OF MAKING AN ELECTROMECHANICAL TRANSDUCER DEVICE

[75] Inventor: Ronald R. Manna, Valley Stream, N.Y.

[73] Assignee: Misonix, Inc., Farmingdale, N.Y.

[21] Appl. No.: 349,968

[22] Filed: Dec. 6, 1994

Related U.S. Application Data

[62] Division of Ser. No. 127,641, Sep. 28, 1993, Pat. No. 5,371,429.

[51] Int. Cl.$^6$ .................................................. H01L 41/22

[52] U.S. Cl. .......................... 29/25.35; 310/328; 310/348

[58] Field of Search ........................... 29/25.35; 310/323, 310/325, 328, 348

[56] References Cited

U.S. PATENT DOCUMENTS

| | | |
|---|---|---|
| 3,103,310 | 9/1963 | Lang . |
| 3,155,141 | 11/1964 | Doyle et al. . |
| 3,214,101 | 10/1965 | Perron . |
| 3,275,059 | 9/1966 | McCullough . |
| 3,328,610 | 6/1967 | Jacke et al. . |
| 3,368,085 | 2/1968 | McMaster et al. . |
| 3,400,892 | 9/1968 | Ensminger . |
| 3,524,085 | 8/1970 | Shoh . |
| 4,153,201 | 5/1979 | Berger et al. . |
| 4,169,984 | 10/1979 | Parisi . |
| 4,223,676 | 9/1980 | Wuchinich et al. . |
| 4,290,074 | 9/1981 | Royer . |
| 4,319,716 | 3/1982 | Lauer . |
| 4,337,896 | 7/1982 | Berger et al. . |
| 4,541,564 | 9/1985 | Berger et al. . |
| 4,850,534 | 7/1989 | Takahashi et al. . |
| 4,978,067 | 12/1990 | Berger et al. . |

FOREIGN PATENT DOCUMENTS

| | | |
|---|---|---|
| 435859 | 12/1974 | U.S.S.R. . |

OTHER PUBLICATIONS

"Ultrasonic Atomizer incorporating a self-acting liquid supply," E. G. Lierke, Ultrasonics, Oct. 1967.

*Primary Examiner*—Carl E. Hall
*Attorney, Agent, or Firm*—R. Neil Sudol; Henry D. Coleman

[57] ABSTRACT

An electromechanical transducer device includes a casing having a distal end and a proximal end, and an acoustic wave generator disposed inside the casing for generating an acoustic type vibration in response to an electrical signal. The acoustic wave generator having an axis extending between the proximal end and the distal end of the casing. An electrical transmission lead is mounted to the casing and is operatively connected to the acoustic wave generator for transmitting an electrical signal to the acoustic wave generator to energize the generator. A wave transmission member is in acoustic contact with the acoustic wave generator for transmitting the vibration from the acoustic wave generator to an active point outside the casing. The wave transmission member includes a stud which defines a fluid guide channel with a continuous wall extending axially through the acoustic wave generator from the active point to the proximal end for guiding fluid between the active point and the proximal end during operation of the acoustic wave generator. Mounting elements are provided for mounting the wave transmission member to the casing, the mounting elements including means for acoustically decoupling the casing and the wave transmission member from one another.

2 Claims, 1 Drawing Sheet

METHOD OF MAKING AN ELECTROMECHANICAL TRANSDUCER DEVICE

This is a division of application Ser. No. 08/127,641 filed Sep. 28, 1993, now U.S. Pat. No. 5,371,429.

BACKGROUND OF THE INVENTION

This invention relates to an electromechanical transducer device. More particularly, this invention relates to high power ultrasonic transducers.

High power ultrasonic transducers have been utilized for many years in applications such as thermoplastic welding, biological processing, degassing of fluids, ceramic milling and localized cleaning. Examples of current art are those manufactured by Heat Systems, Inc. of Farmingdale, N.Y., and Branson Sonic Power Corp. of Danbury, Conn.

These transducers are constructed in the style known as a Langevin sandwich, wherein one or more piezoelectric crystals and a corresponding number of thin metal electrodes are fitted between two masses of acoustically efficient metals, such as aluminum or titanium, and held in a stressed condition by a center bolt. Typical embodiments of this construction are described in U.S. Pat. Nos. 3,328,610, 3,368,085 and 3,524,085.

When a sinusoidal electrical signal is applied across the polarized crystals via the thin metal electrodes, the crystals begin to vibrate, due to the inherent nature of piezoelectric (a/k/a electrostrictive) materials. This phenomenon is well known to those schooled in the art. By shaping the front and rear masses properly, the natural frequency of resonance of the total stack may be adjusted separately from that of the individual crystal elements and the stack becomes an efficient motor for driving a variety of tuned elements, known as horns. These may be simple cylinders, or complex cylindrical or rectangular shapes suited for welding such thermoplastic items as automotive taillight lenses, medical filter housings and toys.

When the horn is to be a solid shape and used for applications such as the ones listed above, the transducer stack is efficient and suitable. However, a host of applications exist where it is desirable to introduce liquid and/or gas to the working surface of the horn tip or to aspirate fluid or gas from the area surrounding the tip via suction. Examples of these applications are the atomization of liquid, surgical devices for tumor/tissue removal and liquid processing such as homogenization of dissimilar or immissible fluids.

An examination of prior art reveals a plethora of designs seeking to accomodate fluid pathway to the tip (distal) end of the tooling. Examples of such designs may be found in U.S. Pat. Nos. 3,464,102, 4,153,201, 4,301,968, 4,337,896, 4,352,459, 4,541,564 and 4,886,491.

Generally, these designs seek to introduce liquid into the transducer at a nodal point or through the center of the transducer via an axial hole. Another solution to the problem of introducing fluids to or removing fluids from a distal end of an ultrasonic device seeks to introduce the liquid at the nodal point of the horn itself. An example of this type of unit is the Model 434 FLO-THRU horn, manufactured by Heat Systems Inc. of Farmingdale, N.Y.

Introducing the liquid (or aspirating the fluid) from the node point of either the transducer or the horn has proven to be adequate if the liquid or gas is free from significant amounts of solids, has a viscosity not significantly greater than that of water and does not solidify readily, However, if any of these conditions exists, the design is prone to clogging or cross contamination of the fluids from batch to batch, since cleaning of passageways is difficult, at best. The fluid pressure needed to overcome the right angle bend within the device is also greater than if the fluid path was straight. This greater pressure yields more loading on the stack, thereby reducing the electrical efficiency of the system.

A more important drawback becomes apparent upon a review the theory of the motion of a body subjected to standing wave vibrations. As is well known in the art, a bar of material with both ends free and subjected to either transverse or longitudinal vibrations has imposed upon it locations of relatively high particle displacement and locations of low or nil particle displacement. These locations are known respectively as antinodes and nodes.

Any material which comes in contact with the areas of high displacement are prone to be coupled to the ultrasonic vibration of the bar. This, in fact, is the theory of operation of an ultrasonic welder, wherein the thermoplastic or thin metal is acoustically vibrated to raise the internal temperature of the material to allow welding. It is accordingly clear that liquid connections, mounting hardware, etc. should only occur at places of no movement, i.e., node points.

However, it is to be noted that node points are theoretical single points along the length of the crystal stack. Practically, it is difficult, if not impossible, to mount a liquid fitting of any size to this node point without it becoming part of the vibratory load. For this reason, the fittings are generally connected to flexible tubing, so as not to vibrate the fittings loose, or worse still, cause fatigue failure of the tubing material.

In addition to the size of the connections, another drawback of this type of construction is that the location of the node point will change as the stack heats or is loaded. This fact exacerbates the problem of mounting the protective case to the stack as well, since an improper mounting location will cause the case to vibrate.

A design improvement currently known in the art moves the liquid entering point to the rear of the unit and allows an axial path through the transducer. With this construction, the path is straight, which allows cleaning with a variety of mechanical brushes, rods, etc. In addition, the straight path imposes the lowest pressure requirement for the liquid stream, easing the design of the pumping system. Since the liquid connection is at the back of the transducer case, the liquid connection may be made concentric with the axial centerline, which lowers the overall dimension of the device and allows a more ergonomically correct system when used in surgical applications.

Although the design offers these improvements, it presents a practical problem for the design of a device which is both functionally suitable as well as manufacturable. Some limitations of the design can be described as follows.

In order to incorporate an axial pathway, the center bolt must be hollow. This immediately presents the problem of how to seal the threads against fluid seepage, since any liquid which enters the crystal stack will lead to electrical shorting or liquid cavitation in the vicinity of the crystals themselves, which serves to heat the stack to high temperatures very rapidly. Both phenomena will lead very quickly to transducer failure.

In order to solve this problem, designers will generally incorporate an O-ring type of seal or seek to seal the threads with a commercially available thread sealant. Both of these solutions are stopgap, since they are prone to failure with time, as the elastomers or sealant lose their compliance.

Another practical limitation of this design is the attachment of the bolt to the end plate of the transducer. As can be appreciated by those schooled in the art, the center bolt, the liquid connection and the rear cover of the transducer case should be one piece in order to be liquid tight. If this design is to be functional, the stack will be designed so that the entire stack enters the case from the rear, with the stack being supported by the solid liquid tube. Although this allows assembly of the system, the case cover and the case are now part of the vibratory load, since the center bolt is now part of the liquid pathway. As has already been discussed, the loading of vibratory elements with static elements should be avoided, since it tends to detune the stack (changes its resonant frequency) and can lead to heating and rapid destruction of the transducer.

OBJECTS OF THE INVENTION

An object of the present invention is to provide an electromechanical transducer device of the above-described type.

Another object of the present invention is to provide an electromechanical transducer device with an axial fluid guide passageway, wherein fluid seepage from the passageway to the transducer crystals is avoided.

Another, more particular, object of the present invention is to provide such an electromechanical transducer device wherein the casing is effectively acoustically decoupled from the transducer crystal assembly.

A further particular object of the present invention is to provide such an electromechanical transducer device wherein assembly is simplified.

Yet another particular object of the present invention is to provide such an electromechanical transducer device wherein the liquid connections at the proximal or rear end of the casing may be changed to any configuration without affecting resonance.

These and other objects of the present invention will be apparent from the drawings and detailed descriptions herein.

SUMMARY OF THE INVENTION

An electromechanical transducer device comprises, in accordance with the present invention, a pressure wave generating component including a piezoelectric crystal assembly, a front driver and a rearwardly extending hollow stud integral with the front driver. Energization elements are operatively connected to the crystal assembly for energizing the assembly to generate an acoustic type vibration. Mounting elements are linked to the front driver and to a casing for mounting the front driver to the casing, while a seal is provided at a rear end of the stud for forming a fluid tight seal between the stud and the casing, the seal being spaced from the crystal assembly.

According to another feature of the present invention, the seal takes the form of an O-ring in contact with the end of the stud and inserted with the stud into a recess in the casing. The recess may be formed in a collar on the casing which extends inwardly into the casing.

According to additional features of the present invention, the casing includes a rear cover element to which the collar is connected and which is provided with a tubular port projection on a side opposite the collar for for attaching liquid transfer conduits to the casing at an end of the stud opposite the front driver.

According to further features of the present invention, the front driver is provided with a substantially radially extending flange, while the mounting elements include at least one flexible O-ring disposed between the flange and the casing for acoustically decoupling the casing and the front driver. The flange is preferably located at a theoretical nodal point of the front driver and the crystal assembly and is flanked by a pair of O-rings.

In a preferred embodiment of the invention, the piezoelectric crystal assembly is configured to define a central channel, the front driver has a shoulder integral with the stud, and the crystal assembly is in operative contact with the shoulder to transmit the vibration through the front driver. Moreover, the stud extends through the channel in the crystal assembly and has a longitudinally extending bore. The pressure wave generating component further includes a rear driver attached to the stud, the crystal assembly being sandwiched between the shoulder of the front driver and the rear driver.

Preferably, the casing includes a locking ring for locking the front driver, the crystal assembly, and the rear driver in place inside the casing.

An electromechanical transducer device comprises, in accordance with another conceptualization of the present invention, pressure wave generating componentry including a piezoelectric crystal assembly, a front driver and a rearwardly extending hollow stud integral with the front driver. Energization elements are operatively connected to the crystal assembly for energizing the assembly to generate an acoustic type vibration. Mounting elements are linked to the front driver and a casing for mounting the front driver to the casing. The front driver is provided with a substantially radially extending flange located at a theoretical nodal point of the front driver and the crystal assembly. The mounting elements include decoupling componentry for acoustically decoupling the casing and the front driver, the decoupling componentry including a pair of O-rings disposed on opposite sides of the flange.

Pursuant to another feature of the present invention, the casing is provided with an annular internal rib, one of the O-rings being sandwiched between the rib and the flange. Where the casing includes a locking ring, another of the O-rings is sandwiched between the locking ring and the flange. Accordingly the flange is flanked by a pair of acoustically decoupling O-rings.

As discussed hereinabove, in a preferred embodiment of the invention, the piezoelectric crystal assembly is configured to define a central channel, the front driver has a shoulder integral with the stud, and the crystal assembly is in at least operative contact with the shoulder to transmit the vibration through the front driver. The stud extends through the channel in the crystal assembly and has a longitudinally extending bore. The pressure wave generating component further includes a rear driver attached to the stud, e.g., via screw threads, while the crystal assembly is sandwiched between the shoulder of the front driver and the rear driver.

An electromechanical transducer device comprises, in accordance with another conceptualization of the present invention, the present invention, pressure wave generating componentry including a piezoelectric crystal assembly, a front driver and a rearwardly extending hollow stud integral with the front driver. Energization elements are operatively connected to the crystal assembly for energizing the assembly to generate an acoustic type vibration, while mounting elements are linked to the front driver and a transducer casing for mounting the front driver to the casing. The crystal assembly particularly includes an annular piezoelectric crystal and electrodes connected to the annular piezoelectric crystal along an inner and an outer cylindrical surface thereof. The piezoelectric crystal is polarized to be excited along a longitudinal axis. An O-ring seal may be provided at a rear end of the stud for forming a fluid tight seal between the stud and the casing, the seal being spaced from the crystal assembly and being inserted with the stud into a recess in the casing.

A method for manufacturing an electromechanical transducer device comprises a method for assembling transducer components including (i) a piezoelectric crystal assembly configured to define a central channel, (ii) a front driver having a main mass, (iii) a hollow stud integral therewith, (iv) an annular flange extending from the main mass, (v) a casing having a main casing body with an inwardly extending annular rib, (vi) a rear cover and a locking ring, and (vii) a plurality of O-ring seals. The manufacturing method comprises the steps of (a) disposing the piezoelectric crystal assembly in main casing body, (b) inserting a first one of the O-ring seals into the casing so that the first one of the O-ring seals rests against the rib, (c) placing the front driver into the main casing body so that the stud extends through the channel and so that the first one of the O-ring seals is sandwiched between the rib and the flange, (d) inserting a second one of the O-ring seals into the casing so that the second one of the O-ring seals rests against the flange on a side thereof opposite the first one of the O-ring seals, and (e) attaching the locking ring to the main casing body so that the second one of the O-ring seals is sandwiched between the locking ring and the flange. Other steps include (f) disposing a third one of the O-ring seals about a free end of the stud, and (g) attaching the rear cover to the main casing body so that the third one of the O-ring seals and the free end of the stud are inserted into a recess in the rear cover, thereby forming a fluid tight seal between the stud and the casing.

Preferably, the stud extends beyond the rear mass on a side of the rear mass opposite the crystal assembly.

An electromechanical transducer device in accordance with the present invention is of the Langevin sandwich type. The stud is machined as an integral part of the front mass or driver. The mounting flange and crystal sandwiching shoulder are also integral parts of the front mass. The casing may be of any configuration which encloses the crystal assembly, the electrodes, the front mass and the rear mass. Those skilled in the art will recognize that the casing may incorporate apertures for forced or unforced cooling gas or liquid. The casing may include a rear case cover carrying the liquid conduit attachment port and the provisions for sealing the port around the rear end of the stud with an acoustically compliant material. The seal may project as far as needed from the rear case cover in order to reach the stud itself.

A transducer device, particularly an ultrasonic transducer device, in accordance with the present invention eliminates the above-discussed shortcomings of existing ultrasonic transducers. The transducer device has a linear or straight liquid pathway design in which the casing and all liquid attachments are acoustically decoupled from the vibratory elements. In addition, seals in the high stress area of the node point are eliminated, which serves to prevent failure of the piezoelectric stack due to liquid seepage in the area of the crystal assembly. Moreover, the transducer device allows for simpler assembly techniques to be utilized, thereby decreasing assembly times and costs.

The absence of seals in the area of the crystal assembly, at node points or at a horn mating point at the distal end of the instrument contributes to longevity inasmuch as the likelihood of breakdown from ultrasound fatigue is reduced. Because the casing is isolated from the crystal assembly and not part of the ultrasonic load, impedance is reduced and mounting hardware does not affect resonant frequency, impedance, etc. The liquid connections at the proximal or rear end of the casing may be changed to any configuration without affecting resonance. Moreover, the converter stack or crystal assembly may be analyzed by conventional means as opposed to FEA, due to the fact that the rear case cover is not part of the vibratory elements.

DETAILED DESCRIPTION

Figure 1:
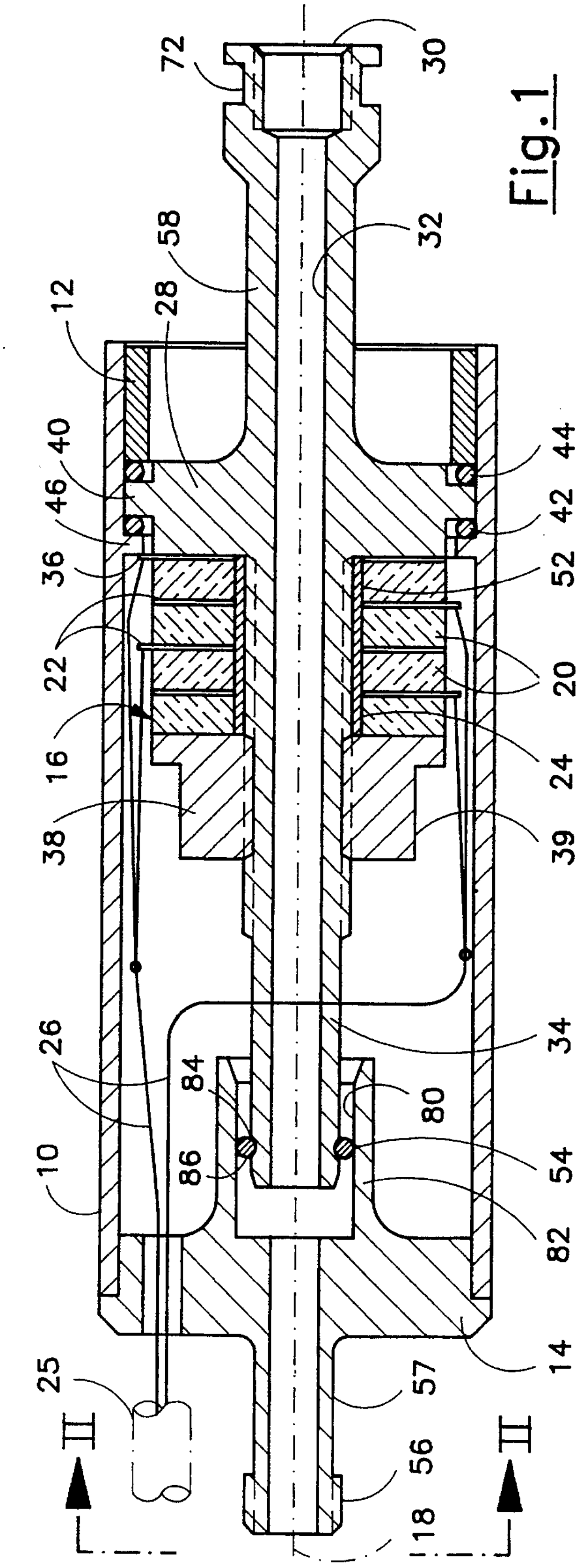
FIG. 1 is a longitudinal cross-sectional view of an electromechanical ultrasonic transducer device in accordance with the present invention.

As illustrated in FIG. 1, an electromechanical ultrasonic transducer device comprises a casing 10 having a locking ring 12 at a distal end and a rear case cover 14 at a proximal end. An acoustic wave generator 16 is disposed inside casing 10 for generating an acoustic type vibration in response to an electrical signal. Acoustic wave generator 16 has an axis 18 extending between the proximal end and the distal end of casing 10. Wave generator 16 includes a plurality of annular piezoelectric crystal disks 20 arranged in a stack with a plurality of transversely oriented metal electrodes 22. This assembly of disk-shaped piezoelectric crystals 20 and electrodes 22 defines a central channel 24 which is coxial with axis 18.

Wave generator 16 is energized to vibrate at an ultrasonic frequency by a high-frequency excitation voltage or electrical signal transmitted over a coaxial cable 25. Cable 25 is connected to rear case cover 14 and terminates in a plurality of electrical transmission leads 26 extending inside casing 10 to electrodes 22. In rear case cover 14, cable 25 passes through a hole (not designated) provided with a strain relief fitted or an electrical connector of any type. A separate earth grounding lead may be connected to crystal assembly or wave generator 16 and casing 10 to provided electrical safety where needed.

A wave transmission member in the form of a front driver 28 is in acoustic contact with wave generator 16 for transmitting the vibration from generator 16 to an active point 30 outside casing 10. At active point 30, front driver 28 is generally connected to a horn or other transmission element (not shown). The horn may be conceived as part of front driver 28, the active point being locatable then at the distal end of the horn.

Front driver 28 is an integral or unitary mass defining a fluid guide channel or bore 32 with a continuous or uninterrupted wall extending axially through acoustic wave generator 16 from active point 30 to the proximal end of casing 10 for guiding fluid between the active point and the proximal end of the casing during operation of acoustic wave generator 16. More particularly, front driver 28 includes a stud 34 extending axially through central channel 24 of crystal assembly or wave generator 16. Fluid guide channel 32 extends through stud 34. Because front driver 28 includes stud 34 as an integral component so that a continuous and uninterrupted fluid flow channel 32 may be provided through crystal assembly or wave generator 16, there is no significant probability that fluid will escape from the channel into casing 10 in the area of the crystal assembly or wave generator.

Front driver 28 also includes a shoulder or crystal mating surface 36 for supporting crystal assembly or wave generator 16 in a Langevin sandwich. Crystal assembly or wave generator 16 is in contact with shoulder 36 to transmit the generated ultrasonic vibration through front driver 28. Generator 16 is pressed between shoulder 36 and a rear mass 38 attached to stud 34 at a rear or proximal end thereof. Stud 34 has an external thread (not designated) matingly engaging an internal thread (not designated) on rear mass 38, thereby enabling a selective tightening of rear mass 38 to press crystal assembly or wave generator 16 against shoulder 36 of front driver 28. To that end, rear mass 38 is provided with structure 39, such as grooves, a hexagonal cross-section, or wrench flats or holes, for receiving an adjustment wrench (not shown) or other tool to facilitate screwing down of the rear mass 38 to the proper torque.

It will be clear to those skilled in the art that front driver 28 and rear mass 38 have tensile properties sufficient to maintain their integrity under the stresses imparted by the operation of crystal assembly or wave generator 16. Current experience shows that titanium and its alloys are most suitable, but other materials such as stainless steel may be alternatively employed with essentially equal effect. Front driver 28 and rear mass 38 may be made of different materials.

The external thread or threads on stud 34 have an outer diameter smaller than the inner diameter of central channel 24 to allow assembly. The root diameter of that external thread or threads generally sets the outer diameter of stud 34. That outer diameter should allow enough of an air gap with respect to the inner diameter of central channel 24 to enable a sufficient amount of insulation to be inserted to prevent electrical arcing.

As further illustrated in FIG. 1, front driver 28 is provided with a radially and circumferentially extending flange 40 for mounting front driver 28 to casing 10. The flange is flanked by two elastomeric O-rings 42 and 44. Proximal O-ring 42 is sandwiched between flange 40 and an internal rib 46 inside casing 10, while distal O-ring 44 is sandwiched between flange 40 and locking ring 12. Flange 40 is located at a theoretical node point of wave generator 16 and front driver 28, while O-rings 42 and 44 serve to acoustically decouple flange 40 and accordingly front driver 28 from casing 10. A plurality of roll pins (not shown) may be attached to front driver 28 along flange 40 for enabling a limited pivoting of front driver 28 relative to casing 10.

An insulator such as a sleeve 52 of polytetrafluoroethylene in inserted between stud 34 and crystal assembly or wave generator 16, along a middle segment of stud 34, while at a rear or proximal end, opposite active point 30, stud 34 is surrounded by an elastomeric O-ring seal 54 made of an acoustically compliant material inserted between the stud and rear case cover 14. Seal 54 serves to form a fluid tight seal between stud 34 and casing 10 and is spaced from crystal assembly or wave generator 16. To that end, stud 34 extends beyond rear mass 38 on a side of rear mass 38 opposite crystal assembly or wave generator 16.

More particularly, the rear or proximal end of stud 34 is inserted into a recess 80 formed by a collar-like extension 82 of rear case cover 14. O-ring seal 54 is seated between collar-like extension 82 and stud 34, in an annular depression or shallow groove 84 on the stud.

Casing 10 and, more specifically, rear case cover 14, includes a port element 56 at the free end of a tubular projection 57 on a side of rear case cover 14 opposite collar-like extension 80. Port element 56 serves in the attachment of liquid transfer conduits (not shown) to casing 10 at a rear or proximal end of front driver 28. Port element 56 may take the form of tapered piped threads, straight threads, luer type fittings or welded connectors.

O-ring seal 54 has an inside dimension suitable for contacting the outer surface of front driver stud 34 to supply sufficient squeeze pressure to seal the junctions of the rear case cover 14 and stud 34 against leakage of gas or liquid at pressures which are to be encountered in the applications for which the transducer device is being used. The proper dimensions for these seals are to be found in commercial or government specifications, such as the Parker O-Ring Handbook and Catalog, published by the Parker Seal Group of Lexington, Ky. It is desirable to reduce the squeeze ratio of the seal to the minimum practical squeeze ratio commensurate with good design practice, in order to minimize the loading on the stud itself. The O-ring 54 may have its gland on stud 34 itself, if the outer diameter of the gland is either smaller than the inner diameter of central channel 24 of generator 16 or is removable from stud 34, to facilitate assembly.

The O-ring sealing area may be extended as far as necessary to engage the end of stud 34, in order to accommodate different case lengths. It may also be machined into the rear case cover, if the case length is to be minimized. It is anticipated that the casing 10 may be made short enough to allow stud 34 to protrude from casing 10 and be exposed. In that case, a separate seal assembly may be utilized.

As additionally illustrated in FIG. 1, front driver 28 is formed on a distal side with an integral distally extending projection 58 coaxial with stud 34. Fluid transfer channel 34 extends through projection 58 to active point 30.

Figure 2:
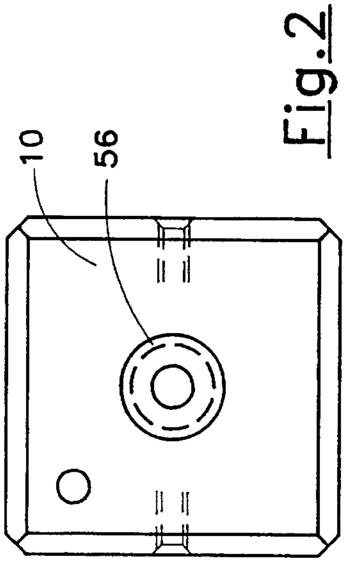
FIG. 2 is an end view taken in the direction of arrows II, II in FIG. 1.

As illustrated in FIG. 2, casing has a rectangular shape. However, it is to be noted that the casing may be of any configuration which encloses crystal assembly or wave generator 16, electrodes 22, front driver 28 and rear mass 38. Those skilled in the art will recognize that casing 10 may incorporate apertures for forced or unforced cooling gas or liquid.

Figure 3:
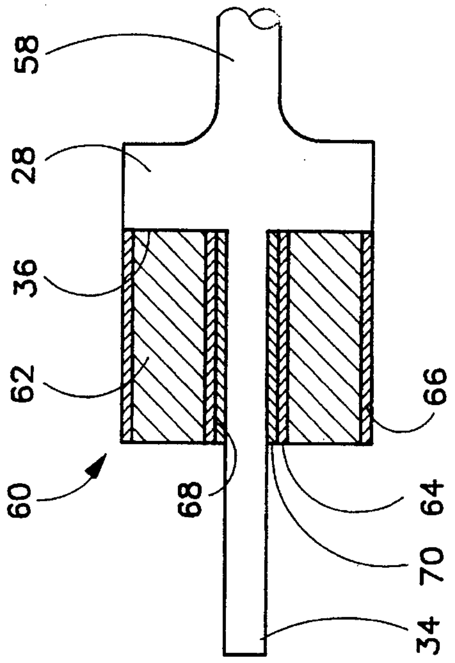
FIG. 3 is a partial cross-sectional view of a modification of the electromechanical ultrasonic transducer device of FIG. 1.

In an alternative specific embodiment of the present invention, depicted in FIG. 3, a crystal assembly or wave generator 60 utilizable in place of crystal generator assembly 16 includes an annular piezoelectric crystal 62 and electrodes 64 and 66 connected to the annular piezoelectric crystal along an inner and an outer cylindrical surface thereof. Crystal 62 is polarized to be excited along its longitudinal axis (coaxial with axis 18). Stud 34 of front driver 28 is inserted through a central channel 68 surrounded by inner electrode 64 and crystal 62. A polytetrafluoroethylene sleeve 70 insulates the crystal assembly or wave generator 60 from stud 34.

The exact diameter of fluid guide channel 32 is not critical, as long as the wall thickness of stud 34 is sufficient to handle stresses arising from the vibratory action of the device. The effect of channel 32 is to render front driver 28 essentially hollow. The front mass may incorporate a female or male threaded section 72 for attaching projection 58 to a horn or tool (not shown) for further amplification of the front face vibration. Alternatively, projection 58 may itself be appropriately shaped to provide adequate amplification at the distal end of front driver 28.

Upon an insertion of stud 34 and sleeve 52 (or 70) through crystal assembly or wave generator 16 (or 60), rear mass 38 is screwed onto the rear or proximal end of stud 34 to an appropriate torque level. O-ring 42 is seated in casing 10 on rib or step 46 and the generator assembly with driver 28 and mass 38 is lowered into casing 10. Subsequently, O-ring 42 is inserted inside casing 10 in contact with flange 40. This has the effect of sandwiching flange 40 between two compliant surfaces. It is to be noted that the outside dimensions of the flange 40 should be smaller than the inside dimensions of the casing 10, to prevent contact with the casing walls. Locking ring 12 is then fitted to the front or distal side of casing 10 to retain the generator assembly therein. Ring 12 should be pressed and held in place by interference fit and/or by pins through the wall of casing 10. The effect is to trap flange 400 between O-rings 42 and 44 for total isolation of the front driver 28 from casing 10 and locking or retainer ring 12.

Upon the fitting of locking ring 12 to casing 10, the cable 25 is connected to rear case cover 14 which is then pressed into casing 10 by interference fit, held in by pins or screws or glued in with commercial adhesives. A gasket or sealant may be used to prevent liquid or vapor penetration of the casing, which may lead to an unsafe condition or destruction of the transducer device.

In assembling the electromechanical ultrasonic transducer device, no special techniques, such as torquing of a plurality of external bolts, welding or brazing of tubing or fittings, attaching flexible tubing internal to the case, etc., are employed. This simplifies assembly procedure and reduces assembly time and costs.

With rear case cover 14 and seal 54 in place, a liquid path is created which incorporates only one seal in an accessible location which is easily verified for integrity or which may be changed regularly in order to prevent catastrophic damage to the transducer stack. The path is straight and may be cleaned mechanically or chemically with ease. The pressure rating of the system is only dependent upon the seal 54 and the wall thickness of stud 34. Pressures well in excess of 100 psi have been successfully tested.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are profferred by way of example to facilitate comprehension of the invention and should not be construed to limit the scope thereof.

What is claimed is:

1. A method for manufacturing an electromechanical transducer device, comprising the steps of:

providing the following components:

a piezoelectric crystal assembly configured to define a central channel;

a front driver having a main mass, a hollow stud integral therewith, and an annular flange extending from said main mass;

a casing having a main casing body with an inwardly extending annular rib, a rear cover and a locking ring; and a plurality of O-ring seals;

disposing said piezoelectric crystal assembly in said main casing body;

inserting a first one of said O-ring seals into said casing so that said first one of said O-ring seals rests against said rib;

placing said front driver into said main casing body so that said stud extends through said channel and so that said first one of said O-ring seals is sandwiched between said rib and said flange;

inserting a second one of said O-ring seals into said casing so that said second one of said O-ring seals rests against said flange on a side thereof opposite said first one of said O-ring seals; and attaching said locking ring to said main casing body so that said second one of said O-ring seals is sandwiched between said locking ring and said flange.

2. The method defined in claim 1, further comprising the steps of:

disposing a third one of said O-ring seals about a free end of said stud; and attaching said rear cover to said main casing body so that said third one of said O-ring seals and said free end of said stud are inserted into a recess in said rear cover, thereby forming a fluid tight seal between said stud and said casing.

* * * * *